United States Patent
Kalisz et al.

(10) Patent No.: US 10,886,491 B2
(45) Date of Patent: Jan. 5, 2021

(54) PROCESS FOR MAKING A METAL CONTAINING LAYER

(71) Applicant: Novaled GmbH, Dresden (DE)

(72) Inventors: Tomas Kalisz, Dresden (DE); Francois Cardinali, Dresden (DE); Jerome Ganier, Dresden (DE); Uwe Gölfert, Tharandt (DE); Vygintas Jankus, Dresden (DE); Carsten Rothe, Dresden (DE); Benjamin Schulze, Dresden (DE); Steffen Willmann, Dresden (DE)

(73) Assignee: Novaled GmbH, Dresden (DE)

( * ) Notice: Subject to any disclaimer, the term of this patent is extended or adjusted under 35 U.S.C. 154(b) by 0 days.

(21) Appl. No.: 15/774,639

(22) PCT Filed: Nov. 10, 2016

(86) PCT No.: PCT/EP2016/077278
§ 371 (c)(1),
(2) Date: May 9, 2018

(87) PCT Pub. No.: WO2017/081159
PCT Pub. Date: May 18, 2017

(65) Prior Publication Data
US 2019/0006611 A1    Jan. 3, 2019

(30) Foreign Application Priority Data

Nov. 10, 2015 (EP) .................... 15193925
Nov. 10, 2015 (EP) .................... 15193926
Nov. 10, 2015 (EP) .................... 15193930

(51) Int. Cl.
*H01L 51/00* (2006.01)
*H01L 51/50* (2006.01)
(Continued)

(52) U.S. Cl.
CPC .......... *H01L 51/5076* (2013.01); *C22C 24/00* (2013.01); *C23C 14/12* (2013.01);
(Continued)

(58) Field of Classification Search
CPC .............. H01L 51/5076; H01L 51/002; H01L 51/5092; H01L 51/0058; H01L 51/0054;
(Continued)

(56) References Cited

U.S. PATENT DOCUMENTS 4,818,645 A * 4/1989 Harris ............. H01M 4/40
  252/182.1
5,853,817 A * 12/1998 Murayama ......... C23C 14/06
  427/488

(Continued)

FOREIGN PATENT DOCUMENTS

EP   1024542 A1   8/2000
EP   2247163 A2   11/2010
(Continued)

OTHER PUBLICATIONS

PCT International Search Report and Written Opinion for PCT Application No. PCT/EP2016/077278 dated Feb. 10, 2017 (16 pages).
(Continued)

*Primary Examiner* — Vu A Vu
(74) *Attorney, Agent, or Firm* — Eversheds Sutherland (US) LLP

(57) ABSTRACT

Process for preparing a metal containing layer, the process comprising (i) at least one step of co-vaporization, at a pressure which is lower than $10^{-2}$ Pa, of a) at least one first metal selected from Li, Na, K, Rb and Cs and b) at least one second metal selected Mg, Zn, Hg, Cd and Te from a metal alloy provided in a first vaporization source which is heated to a temperature between 100° C. and 600° C., and (ii) at least one
(Continued)

least one subsequent step of deposition of the first metal on a surface having a temperature which is below the temperature of the first vaporization source, wherein in step (i), the alloy is provided at least partly in form of a homogeneous phase comprising the first metal and the second metal, electronic devices comprising such materials and process for preparing the same.

30 Claims, 1 Drawing Sheet

(51) Int. Cl.
  *C22C 24/00*    (2006.01)
  *C23C 14/12*    (2006.01)
  *C23C 14/14*    (2006.01)
  *H01L 51/42*    (2006.01)

(52) U.S. Cl.
  CPC ............ C23C 14/14 (2013.01); H01L 51/001 (2013.01); H01L 51/002 (2013.01); H01L 51/5092 (2013.01); *H01L 51/006* (2013.01); *H01L 51/0052* (2013.01); *H01L 51/0054* (2013.01); *H01L 51/0058* (2013.01); *H01L 51/0061* (2013.01); *H01L 51/0071* (2013.01); *H01L 51/0072* (2013.01); *H01L 51/0073* (2013.01); *H01L 51/42* (2013.01); *Y02E 10/549* (2013.01)

(58) Field of Classification Search
  CPC ............ H01L 51/0052; H01L 51/0061; H01L 51/0072; H01L 51/42; H01L 51/0071; H01L 51/006; H01L 51/0073; H01L 51/001; H01L 51/0021; H01L 51/5203; H01L 51/56; C22C 24/00; C23C 14/12; C23C 14/14; C23C 14/24; C23C 28/021; Y02E 10/549
  USPC ............................................. 257/40
  See application file for complete search history.

(56) References Cited

U.S. PATENT DOCUMENTS

| | | | |
|---|---|---|---|
| 6,010,750 | A | 1/2000 | Gole et al. |
| 6,325,988 | B1* | 12/2001 | Inoue ................. C01G 45/1242 |
| | | | 423/599 |
| 8,507,106 | B2* | 8/2013 | Kawamura ............. C07C 15/38 |
| | | | 313/504 |
| 2002/0180349 | A1 | 12/2002 | Aziz et al. |
| 2006/0263593 | A1 | 11/2006 | Aziz et al. |
| 2008/0136318 | A1 | 6/2008 | Kashiwabara |
| 2013/0157147 | A1* | 6/2013 | Li ......................... H01M 4/525 |
| | | | 429/332 |
| 2013/0240843 | A1* | 9/2013 | Choi ................... H01L 51/0035 |
| | | | 257/40 |
| 2013/0292665 | A1* | 11/2013 | Ono ....................... C09K 11/06 |
| | | | 257/40 |
| 2017/0338473 | A1* | 11/2017 | Cho ...................... H01M 4/505 |

FOREIGN PATENT DOCUMENTS

| | | |
|---|---|---|
| EP | 1999291 B1 | 4/2012 |
| JP | S60-165771 S | 8/1985 |
| JP | 2002-248358 A | 9/2000 |
| JP | 2005-108692 A | 4/2005 |

OTHER PUBLICATIONS

European Search Report for EP Application No. 15193930.3 dated May 19, 2016 (10 pages).

Xie et al., "Formation, Confirmation and Application of Li:Al Alloy as an Electron Injection Layer with Li3N as the Precursor," J. Phys. D. Appl. Phys., 2010, 43:1-4.

English translation of the Chinese first Office Action for Application No. 201680065794.7, dated Oct. 12, 2019.

Japanese Office Action for JP Application No. 2018-543454 dated Oct. 26, 2020 (3 pages).

\* cited by examiner

PROCESS FOR MAKING A METAL CONTAINING LAYER

CROSS REFERENCE TO RELATED APPLICATIONS

This application is a U.S. national stage application of PCT/EP2016/077278, filed Nov. 10, 2016, which claims priority to European Application Nos. 15193925.3, 15193926.1, and 15193930.3, each filed Nov. 10, 2015. The contents of these applications are incorporated herein by reference.

The present invention concerns a processes for preparation of a metal-containing layer and of an electronic device comprising such layer, the layer preparable by the inventive process and electronic device comprising such layer, and layers and metal alloys prepared by the inventive process and applicable as intermediates for preparing electronic devices.

I. BACKGROUND OF THE INVENTION

Among the electronic devices comprising at least a part based on material provided by organic chemistry, organic light emitting diodes (OLEDs) have a prominent position. Since the demonstration of efficient OLEDs by Tang et al. in 1987 (C. W. Tang et al., Appl. Phys. Lett. 51 (12), 913 (1987)), OLEDs developed from promising candidates to high-end commercial displays. An OLED comprises a sequence of thin layers substantially made of organic materials. The layers typically have a thickness in the range of 1 nm to 5 µm. The layers are usually formed either by means of vacuum deposition or from a solution, for example by means of spin coating or jet printing.

OLEDs emit light after the injection of charge carriers in the form of electrons from the cathode and in form of holes from the anode into organic layers arranged in between. The charge carrier injection is effected on the basis of an applied external voltage, the subsequent formation of excitons in a light emitting zone and the radiative recombination of those excitons. At least one of the electrodes is transparent or semitransparent, in the majority of cases in the form of a transparent oxide, such as indium tin oxide (ITO), or a thin metal layer.

Among the matrix compounds used in OLED light emitting layers (LELs) or electron transporting layers (ETLs), important position have the compounds that comprise at least one structural moiety comprising a delocalized system of conjugated electrons and/or compounds which comprise atoms bearing free electron pairs. During last decade, a particular attention attracted matrix compounds showing various combinations of both functional features—the presence of free electron pairs, localized for example on atoms of $15^{th}$-$16^{th}$ group of the Periodic Table, as well as the presence of delocalized systems of conjugated electrons, provided most frequently in form or unsaturated organic compounds. Currently, broad spectrum of electron transport matrices is available, ranging from hydrocarbon matrices comprising only homocyclic aromatic systems and/or double and triple carbon-carbon bonds, to matrices comprising highly polar groups selected from phosphine oxide and diazole.

Electrical doping of charge transporting semiconducting materials for improving their electrical properties, especially conductivity, is known since 1990s, e.g. from U.S. Pat. No. 5,093,698 A. An especially simple method for n-doping in ETLs prepared by the thermal vacuum deposition, which is currently the standard method most frequently used, e.g. in industrial manufacture of displays, is vaporization of a matrix compound from one vaporization source and of a highly electropositive metal from another vaporization source and their co-deposition on a cool surface. There is an inherent discrepancy between the need for stronger n-dopants and high reactivity and sensitivity of such dopant to ambient conditions, which makes their industrial application generally and, specifically, the fulfilment of contemporary quality assurance (QA) requirements difficult.

The state of the art is briefly summarized in a previous application published as WO2015/097232, in which applicants successfully addressed some of the above mentioned problems. Despite continuing progress in this field, there is still an unmet demand for strong n-dopants, able to provide high-performance semiconducting materials with a broad spectrum of matrix compounds, under mild and highly reproducible processing conditions.

It is an object of the invention to overcome the drawbacks of the prior art and to provide an improved method for preparing layers comprising highly active alkali metals in their substantially elemental form and for preparing electronic devices comprising such alkali metal containing layers. The second object of the invention is to provide metal containing layers and electronic devices preparable by inventive process and having improved properties. The third object of the invention is providing metal containing layers and metal alloys applicable as intermediates in the inventive process and allowing easy preparation of electronic devices comprising an alkali metal containing layer.

II. SUMMARY OF THE INVENTION

The object is achieved by a process for preparation of a metal containing layer, the process comprising
(i) at least one step of co-vaporization, at a pressure which is lower than $10^{-2}$ pa, of
  a) at least one first metal selected from Li, Na, K, Rb and Cs and
  b) at least one second metal selected Mg, Zn, Hg, Cd and Te
  from a metal alloy provided in a first vaporization source which is heated to a temperature between 100° C. and 600° C., and
(ii) at least one subsequent step of deposition of the first metal on a surface having a temperature which is below the temperature of the first vaporization source,
wherein in step (i),
the alloy is provided at least partly in form of a homogeneous phase comprising the first metal and the second metal.

Under metal alloy, it is to be understood a substantially metallic composition in which at least 90 atomic %, preferably at least 95 at %, more preferably at least 98 at %, even more preferably at least 99 at %, most preferably at least 99.9 at % are metallic elements. All elements except hydrogen, boron, carbon, silicon, nitrogen, phosphorus, arsenic, oxygen, sulfur, selenium, halogens and rare gases are considered metallic.

Preferably, the pressure is lower than $5.10^{-3}$ Pa, more preferably lower than $10^{-3}$ Pa, even more preferably lower than $5.10^{-4}$ Pa, most preferably lower than $10^{-4}$ Pa. Also preferably, the first vaporization source is heated to a temperature between 150° C. and 550° C., more preferably between 200° C. and 500° C., even more preferably between 250° C. and 450° C., and most preferably between 300° C. and 400° C.

In one embodiment, step (i) further comprises co-vaporization, at a pressure which is lower than $10^{-2}$ Pa, of at least one substantially covalent matrix compound from a substantially covalent matrix material provided in a second vaporization source, wherein the second vaporization source is heated to a temperature between 100° C. and 600° C.; and wherein, in step (ii), the at least one substantially covalent matrix compound is co-deposited on the surface having a temperature which is below the temperature of the first vaporization source and below the temperature of the second vaporization source.

For the first vaporization source and for the second vaporization source, the same preferred ranges of operational temperature and pressure apply.

In another embodiment, in step (ii), the second metal is co-deposited with the first metal and, if present, with the substantially covalent matrix compound on the surface.

In one embodiment, the metal alloy provided in the first vaporization source is homogeneous.

Under homogeneous metal alloy, it is to be understood an alloy consisting of a single solid or liquid phase. Preferably, the single phase is solid.

It is supposed that in the process according to invention, the first metal deposited in the step (ii) is at least partially in a substantially elemental form.

Under substantially elemental form, it is to be understood a form that is, in terms of electronic states and their energies and in terms of chemical bonds of comprised metal atoms, closer to the form of an elemental metal, of a free metal atom or to the form of a cluster of metal atoms, than to the form of a metal salt, of an organometallic metal compound or another compound comprising a covalent bond between metal and non-metal, or to the form of a coordination compound of a metal.

It is to be understood that metal alloys represent, besides neat elemental metals, atomized metals, metal molecules and metal clusters, another example of substantially elemental form of metals.

Preferred first metal in the composition provided in the first vaporization source is sodium; preferred second metal in the composition provided in the first vaporization source is zinc.

In another embodiment, the first metal in the composition provided in the first vaporization source may be lithium and/or the second metal in the composition provided in the first vaporization source may be magnesium.

It is further preferred that in the metal alloy provided in the first vaporization source, the total amount of the first and second metals forms at least 10 weight %, more preferably at least 50 wt %, even more preferably at least 90 wt %, even more preferably at least 95 wt %, most preferably at least 99 wt % of the alloy.

Preferably, the total amount of the first metal is less than 95 wt %, preferably less than 90 wt %, more preferably less than 50 wt %, even more preferably less than 20 wt %, most preferably less than 10 wt %, and still preferably less than 5 wt % with respect to the total amount of the first and the second metal in the alloy.

It is further preferred that the amount of the first metal is more than 0.01 wt %, preferably more than 0.1 wt %, more preferably more than 0.5 wt %, even more preferably more than 1 wt %, most preferably more than 2 wt %, and still preferably more than 5 wt % of the total amount of the first metal and of the second metal comprised in the metal alloy.

Also preferably, the temperature of the first vaporization source is lower than melting point of the metal alloy.

In one embodiment, the temperature of the first vaporization source is higher than the melting point of any of the first and/or the second metal comprised in the alloy.

In another embodiment, the temperature of the first vaporization source is higher than the melting point of the first metal and lower than the melting point of the second metal comprised in the alloy.

It is to be understood that "substantially covalent" means compounds comprising elements bound together mostly by covalent bonds. Substantially covalent matrix material consists of at least one substantially covalent compound. Substantially covalent materials can comprise low molecular weight compounds which may be, preferably, stable enough to be processable by vacuum thermal evaporation (VTE) without decomposition. Alternatively, substantially covalent materials can comprise polymeric material, if such material can, e.g. due its partial depolymerization at elevated temperature of the second vaporization source, release compounds with molecular weight low enough to enable their vaporization in high vacuum. Preferred polymeric substantially covalent matrix compounds comprise both skeletal as well as peripheral atoms. Skeletal atoms of the substantially covalent compound are covalently bound to at least two neighbour atoms. Other atoms of the substantially covalent compound are peripheral atoms which are covalently bound with a single neighbour atom. A compound comprising cations and anions is considered as substantially covalent, if at least the cation or at least the anion comprises at least ten covalently bound atoms.

Preferred examples of substantially covalent matrix compounds are organic compounds, consisting predominantly from covalently bound C, H, O, N, S, which may optionally comprise also covalently bound B, P, As, Se. Organometallic compounds comprising covalent bonds carbon-metal, metal complexes comprising organic ligands and metal salts of organic acids are further examples of organic compounds that may serve as organic matrix compounds.

In one embodiment, the organic matrix compound lacks metal atoms and majority of its skeletal atoms is selected from C, O, S, N.

In one of preferred embodiments, wherein the metal containing layer is suitable as electron transport layer or electron injection layer, it may be advantageous that reduction potential of any substantially covalent matrix compound of the substantially covalent matrix material, if measured by cyclic voltammetry under the same standardized conditions, has the value which is more negative than the value obtained for tetrakis(quinoxalin-5-yloxy)zirconium, preferably more negative than for 4,4'-bis(4,6-diphenyl-1,3,5-triazin-2-yl)-1,1'-biphenyl, more preferably more negative than for 2,4,6-tri(biphenyl-4-yl)-1,3,5-triazine, even more preferably more negative than for 2,4,6-triphenyltriazine, even more preferably more negative than for 2,4,7,9-tetraphenyl-1,10-phenanthroline, highly preferably more negative than for 4,7-diphenyl-1,10-phenanthroline, even more preferably more negative than for 1,3,5-tris(1-phenyl-1H-benzimidazol-2-yl)benzene, most preferably more negative than for pyrene and still preferably more negative than for [1,1'-binaphthalen]-2,2'-diylbis(diphenylphosphine oxide).

On the other hand, it is preferred that the substantially covalent matrix material consists of substantially covalent matrix compounds having their redox potentials, if measured for each compound individually under standardized conditions, less negative than N2,N2,N2',N2',N7,N7,N7',N7'-octaphenyl-9,9'-spirobi[fluorene]-2,2',7,7'-tetraamine, preferably less negative than triphenylene, more preferably less negative than N4,N4'-di(naphthalen-1-yl)-N4,N4'-diphenyl-[1,1'-biphenyl]-4,4'-diamine, even more preferably less negative than bis(4-(9H-carbazol-9-yl)phenyl)(phenyl) phosphine oxide, most preferably less negative than 3-([1, 1'-biphenyl]-4-yl)-5-(4-(tert-butyl)phenyl)-4-phenyl-4H-1, 2,4-triazole.

In another embodiment, the substantially covalent matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic or heteroaromatic ring adhering to the Hückel rule. Also preferably, the substantially covalent matrix compound may comprise at least two aromatic or heteroaromatic rings which are either linked by a covalent bond or condensed.

In one of specific embodiments, the substantially covalent matrix compound comprises a ring consisting of covalently bound atoms and at least one atom in the ring is phosphorus.

In a more preferred embodiment, the phosphorus-containing ring consisting of covalently bound atoms is a phosphepine ring.

In another preferred embodiment, the substantially covalent matrix compound comprises a phosphine oxide group. Also preferably, the substantially covalent matrix compound comprises a heterocyclic ring comprising at least one nitrogen atom. Examples of nitrogen containing heterocyclic compounds which are particularly advantageous as organic matrix compound for the inventive semiconducting material are matrices comprising, alone or in combination, pyridine structural moieties, diazine structural moieties, triazine structural moieties, quinoline structural moieties, benzoquinoline structural moieties, quinazoline structural moieties, acridine structural moieties, benzacridine structural moieties, dibenzacridine structural moieties, diazole structural moieties and benzodiazole structural moieties.

The first object is further achieved by process for preparation of an electronic device comprising at least two distinct layers sandwiched between a first electrode and a second electrode and, optionally, other parts of the device arranged outside the space between the electrodes, wherein at least one of the at least two distinct layers comprises (a) at least one first metal selected from the group consisting of Li, Na, K, Rb and Cs, and, optionally,
(ba) at least one second metal selected from the group consisting of Mg, Zn, Hg, Cd and Te, and/or
(bb) at least one substantially covalent matrix compound,
the process comprising the steps
(i) providing subsequently one electrode and, if present in the device, the layers arranged between the first electrode and the layer comprising the first metal,
(ii) providing the layer containing the first metal by the inventive process described above, and
(iii) providing, if present in the device, the remaining layers between the layer comprising the first metal and the second electrode, the second electrode, and, if present, any other parts of the device arranged outside the space between the electrodes.

The second object of the invention is achieved by metal containing layer deposited on a surface, the metal containing layer prepared by process described in the preceding paragraphs.

The metal containing layer is preferably part of an electronic device. In this embodiment, the metal containing layer has, usually, thickness less than 150 nm, preferably less than 100 nm, more preferably less than 70 nm, even more preferably less than 50 nm, most preferably less than 40 nm, still preferably less than 30 nm.

Also preferably for use in electronic devices, the preferred minimum thickness of the metal containing layer is 1 nm, more preferably 2 nm, even more preferably 3 nm, most preferably 5 nm, still preferably 10 nrn.

In one of possible embodiments, the metal containing layer is substantially homogeneous. It is to be understood that the substantially homogeneous layer does not contain spatial domains which could be distinguished from each other in terms of chemical composition and/or physicochemical properties or such domains do not exceed in any direction the size 1 micrometer.

In another possible embodiment, the metal containing layer is substantially isotropic. It is to be understood that in the substantially isotropic layer, any component or physicochemical property of the layer does not exhibit systematic change in any chosen direction.

It is supposed that in the metal containing layer, at least one first metal and at least one second metal are, each independently, at least partially present in their substantially elemental form. It is supposed that every metal which was deposited in the doped material in its substantially elemental form remains at least partially in its substantially elemental form also when it is embedded in the substantially covalent matrix material.

In one embodiment, the first metal is selected from Na and/or the second metal is selected from Zn. In a preferred embodiment, the first metal is Na and the second metal is Zn.

In another embodiment, the first metal in the composition provided in the first vaporization source may be lithium and/or the second metal in the composition provided in the first vaporization source may be magnesium.

The metal containing layer prepared by the inventive process may comprise the substantially covalent matrix material, or be a metallic layer consisting substantially of the first and the second metal, or it may consist substantially of the first metal.

In a preferred embodiment, the second metal co-deposits in the step (ii) with the first metal and the layer comprising the first metal comprises also the second metal.

It is to be understood that the term "metallic" refers to a material or layer consisting of at least 90 atomic %, preferably at least 95 at %, more preferably at least 98 at %, even more preferably at least 99 at %, most preferably at least 99.9 at % of metallic elements. All elements except hydrogen, boron, carbon, silicon, nitrogen, phosphorus, arsenic, oxygen, sulfur, selenium, halogens and rare gases are considered metallic in this application. The metallic layer may exhibit metallic electrical conductivity or semiconductivity.

In one embodiment, the total content of the first metal and the substantially covalent matrix material in the metal containing layer prepared by the inventive process is higher than 90 wt %, in another embodiment, it may be higher than 99 wt %, and in still another embodiment, it might be higher than 99.9 wt %.

It is possible that the metallic layer prepared by the inventive process contains more than 90 wt % of the first metal. In another embodiment, the metallic layer prepared by the inventive process may contain more than 99 wt % of the first metal. In still another embodiment, the metallic layer prepared by the inventive process may contain more than 99.9 wt % of the first metal.

In one embodiment of the metal containing layer comprising the substantially covalent matrix compound, the total amount of the first and second metal forms less than 50 wt %, preferably less than 25 wt %, more preferably less than 15 wt %, even more preferably less than 10 wt %, most preferably less than 7 wt %, and still preferably less than 5 wt % of the layer.

In another embodiment of the metal containing layer comprising the substantially covalent matrix compound, the total amount of the first and second metal forms more than 0.01 wt %, preferably more than 0.1 wt %, more preferably more than 0.5 wt %, even more preferably more than 1 wt %, most preferably more than 2 wt %, and still preferably more than 5 wt % of the layer.

In another embodiment, the total amount of the first metal is less than 95 wt %, preferably less than 90 wt %, more preferably less than 50 wt %, even more preferably less than 20 wt %, most preferably less than 10 wt %, and still preferably less than 5 wt % of the overall amount of the first and second metal comprised in the metal containing layer.

In still another embodiment, the total amount of the first metal is more than 0.01 wt %, preferably more than 0.1 wt %, more preferably more than 0.5 wt %, even more preferably more than 1 wt %, most preferably more than 2 wt %, and still preferably more than 5 wt % of the overall amount of the first and second metal comprised in the metal containing layer.

The second object of the invention is further achieved by
  electronic device comprising at least two distinct layers sandwiched between a first electrode and a second electrode and, optionally, other parts of the device arranged outside the space between the electrodes, wherein at least one of the at least two distinct layers comprises
  (a) at least one first metal selected from the group consisting of Li, Na, K, Rb and Cs,
  (b) at least one second metal selected from the group consisting of Mg, Zn, Hg, Cd and Te, and, optionally,
  (c) at least one substantially covalent matrix compound, obtainable by a process comprising the steps
  (i) providing subsequently the first electrode and, if present in the device, the layers arranged between the first electrode and the layer comprising the first metal,
  (ii) providing the layer containing the first metal and the second metal by the inventive process described above, and
  (iii) providing, if present in the device, the remaining layers between the layer comprising the first metal and the second electrode, and, if present, any other parts of the device arranged outside the space between the electrodes.

Preferably, the device is an organic light emitting diode or an organic photovoltaic device.

In one embodiment, the metal containing layer is adjacent to an electrode. More preferably, the electrode adjacent to the metal containing layer is a cathode.

In one of preferred embodiments, the cathode is metallic. It is understood that the definition of the term "metallic" as provided above for a material or layer applies equally for an electrode or a cathode. The metallic cathode may consist of a pure metal or of a metal alloy and may exhibit metallic electrical conductivity or semiconductivity.

Optionally, the electronic device may comprise both the metallic layer prepared by the process according to invention as well as the metal containing layer which comprises also the substantially covalent matrix.

In one embodiment, the metallic layer prepared by the inventive process and another layer prepared by the inventive process are adjacent to each other in the device.

Preferably, the metallic layer comprised in the device comprises at least one first metal selected from Li, Na, K, Rb and Cs and at least one second metal selected from Mg, Zn, Cd, Hg and Te. More preferably, the second metal in the metallic layer is Zn. In another embodiment, the second metal in the metallic layer is Mg. It is preferred that in the metallic layer which is comprised in the electronic device, the total amount of the first and second metal in the metallic layer is at least 90 wt %, more preferably at least 95 wt %, even more preferably at least 98 wt %, even more preferably at least 99 wt %, most preferably at least 99.5 wt %. In one embodiment, the first metal in the metallic layer may be lithium and the second metal may be magnesium. In one embodiment, the metallic layer may consist of lithium and magnesium.

It is preferred that the metallic layer comprised in the electronic device has thickness in the range 1-100 nm, more preferably in the range 2-50 nm, even more preferably in the range 3-30 nm, most preferably in the range 5-20 nm.

In one embodiment, the metallic layer is adjacent to the cathode. In another embodiment, the metallic layer may be provided as part of the charge generation layer, preferably as part of the electron transporting part of the charge generation layer.

Alternatively, or in addition, the metal containing layer may be adjacent directly to the electron transport layer.

In one embodiment, the second object is achieved by an
  electronic device comprising a first electrode, a second electrode, and, arranged between the first and the second electrode, at least one layer comprising a substantially covalent matrix compound, wherein the device comprises, arranged preferably between the first and the second electrode, at least one layer comprising
  (i) lithium and magnesium in substantially elemental form and,
  (ii) optionally, at least one substantially covalent matrix compound.

Preferred embodiments of the device comprising the layer comprising lithium and magnesium in substantially elemental form are selected from an organic electroluminescent device and an organic photovoltaic device.

In one embodiment, the layer comprising lithium and magnesium in substantially elemental form, in the device comprising such layer, is an electron injection layer, an electron transport layer, or a charge generating layer.

The third object of the invention is achieved by metal containing layer obtainable by the inventive process as an intermediate for the preparation of an electronic device, and by the use of such layer as the intermediate for the preparation of electronic devices. In a preferred embodiment, the layer, prepared for the use as an intermediate in the process according to invention, contains at least one first metal selected from Li, Na, K, Rb and Cs and at least one second metal selected from Mg, Zn, Cd, Hg and Te and, optionally, at least one substantially covalent matrix compound.

It is understood that the layer prepared by the process
  according to invention is substantially free of components which are more volatile than the most volatile component selected from
  (i) the first metal comprised in the layer,
  (ii) the second metal comprised in the layer and
  (iii) the substantially covalent matrix compound comprised in the layer.

Preferably, the total amount of the first metal in the layer is at least 0.01 wt %, preferably more than 0.1 wt %, more preferably more than 0.5 wt %, even more preferably more than 1 wt %, most preferably more than 2 wt %, and still preferably more than 5 wt %.

Also preferably, the layer is metallic. More preferably, the content of the second metal in the layer is at least 80 wt %, preferably more than 85 wt %, even more preferably more than 90 wt %, most preferably more than 95 wt %. Also preferably, the second metal is Zn.

Also preferably, the layer for use as an intermediate is disintegrated before its use in the process according to invention. Most preferably, the layer in the disintegrated form is used as the alloy provided in the first vaporization source. A preferred method of disintegration is grinding.

The third object is further achieved by use of a metal alloy, the alloy comprising at least one homogeneous phase comprising at least one first metal selected from Li, Na, K, Rb and Cs and at least one second metal selected from Mg, Zn, Cd, Hg and Te, for preparation of a layer containing the at least one first metal and/or for preparation of an electronic device comprising the layer containing the at least one first metal.

In one embodiment, the first metal is sodium and/or the second metal is zinc. In another embodiment, the total amount of the first metal is less than 95 wt %, preferably less than 90 wt %, more preferably less than 50 wt %, even more preferably less than 20 wt %, most preferably less than 10 wt %, and still preferably less than 5 wt % with respect to the total weight of the first and the second metal in the alloy.

In another embodiment, the first metal is lithium and/or the second metal is magnesium. More preferably, the metal alloy comprises lithium and magnesium. In one embodiment, the metal alloy may consist of lithium and magnesium.

In one embodiment, the total amount of the first metal in the alloy is more than 0.01 wt %, preferably more than 0.1 wt %, more preferably more than 0.5 wt %, even more preferably more than 1 wt %, most preferably more than 2 wt %, and still preferably more than 5 wt %.

III. BRIEF DESCRIPTION OF DRAWINGS

IV. DETAILED DESCRIPTION OF THE INVENTION

Device Architect

Figure 1:
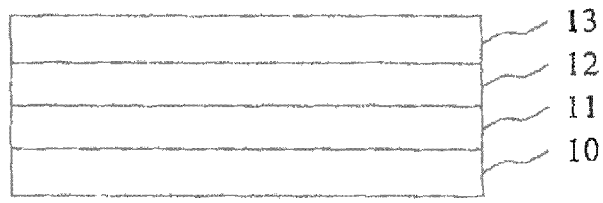
FIG. 1 shows a schematic illustration of a device in which the present invention can be incorporated.

FIG. 1 shows a stack of anode (10), organic semiconducting layer (11) comprising the t emitting layer, electron transporting layer (ETL) (12), and cathode (13). Other layers can be inserted between those depicted, as explained herein.

Figure 2:
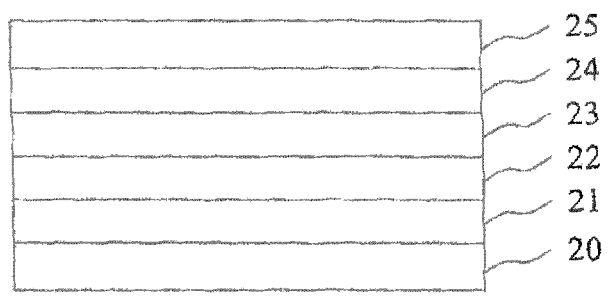
FIG. 2 shows a schematic illustration of a device in which the present invention can be incorporated.

FIG. 2 shows a stack of an anode (20), a hole injecting and transporting layer (21), a hole transporting layer (22) which can also aggregate the function of electron blocking, a light emitting layer (23), an ETL (24), and a cathode (25). Other layers can be inserted between those depicted, as explained herein.

The wording "device" comprises the organic light emitting diode.

Material Properties—Energy Levels

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to onset of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation ($E_{ox}$) and reduction ($E_{red}$) potential. An adequate method is, for example, cyclic voltammetry. To avoid confusion, the claimed energy levels are defined in terms of comparison with reference compounds having well defined redox potentials in cyclic voltammetry, when measured by a standardized procedure. A simple rule is very often used for the conversion of redox potentials into electron affinities and ionization potential: IP (in eV)=4.8 eV+e*$E_{ox}$ (wherein $E_{ox}$ is given in volts vs. ferrocenium/ferrocene (Fc$^+$/Fc)) and EA (in eV)=4.8 eV+e*$E_{red}$ ($E_{red}$ is given in volts vs. Fc$^+$/Fc) respectively (see B. W. D'Andrade, Org. Electron. 6, 11-20 (2005)), e* is the elemental charge. Conversion factors for recalculation of the electrochemical potentials in the case other reference electrodes or other reference redox pairs are known (see A. J. Bard, L. R. Faulkner, "Electrochemical Methods: Fundamentals and Applications", Wiley, 2. Ausgabe 2000). The information about the influence of the solution used can be found in N. G. Connelly et al., Chem. Rev. 96, 877 (1996). It is usual, even if not exactly correct, to use the terms "energy of the HOMO" $E_{(HOMO)}$ and "energy of the LUMO" $E_{(LUMO)}$, respectively, as synonyms for the ionization energy and electron affinity (Koopmans Theorem). It has to be taken into consideration that the ionization potentials and the electron affinities are usually reported in such a way that a larger value represents a stronger binding of a released or of an absorbed electron, respectively. The energy scale of the frontier molecular orbitals (HOMO, LUMO) is opposed to this. Therefore, in a rough approximation, the following equations are valid: IP=−$E_{(HOMO)}$ and EA=$E_{(LUMO)}$ (the zero energy is assigned to the vacuum).

For the chosen reference compounds, the inventors obtained following values of the reduction potential by standardized cyclic voltammetry in tetrahydrofuran (THF) solution vs. Fc$^+$/Fc:

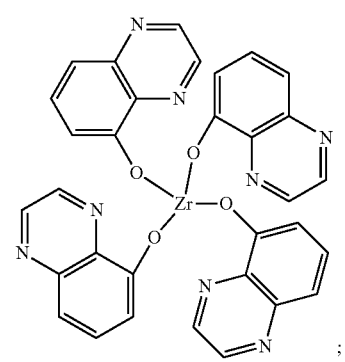

tetrakis(quinoxalin-5-yloxy)zirconium
(ZrTQO), CAS 1207671-22-4, -1.78 V, G0

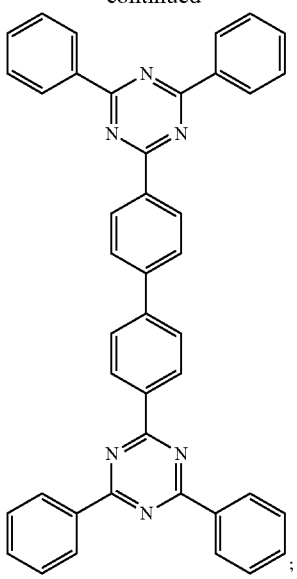
4,4′-bis(4,6-diphenyl-1,3,5-triazin-2 yl)-
1,1′-biphenyl (BTB),
CAS 266349-83-1, -2.03V, G1
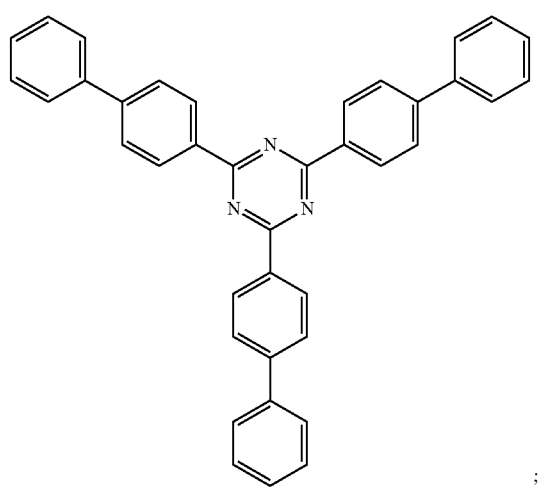
2,4,6-tri(biphenyl-4-yl)-1,3,5-triazin(TBT),
CAS 31274-51-8, -2.11 V, G2
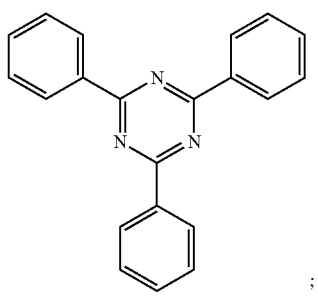
2,4,6-triphenyltriazine,
CAS 493-77-6, -2.20 V, G3
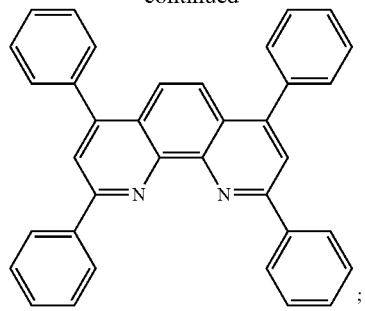
2,4,7,9-tetraphenyl-1,10-phenanthroline,
CAS 51786-73-3, -2.33 V, G4
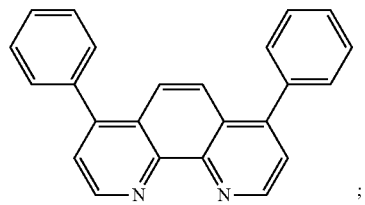
4,7-diphenyl-1,10-phenanthroline,
(Bphen)
CAS 162-01-7, -2.47 V, G5
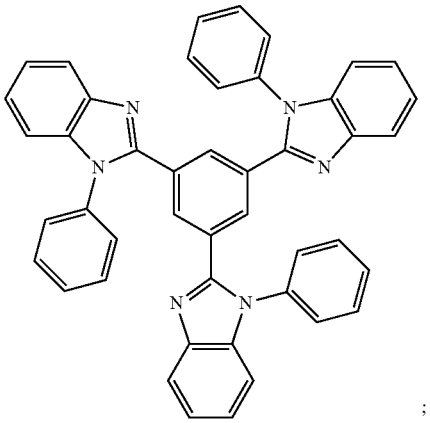
1,3,5-tris(1-phenyl-1H-benzimidazol-2-yl)benzene
(TPBI)
CAS 192198-85-9, -2.58 V, G6
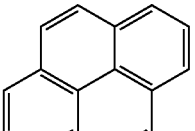
pyrene, CAS 129-00-0,
-2.64 V, G7
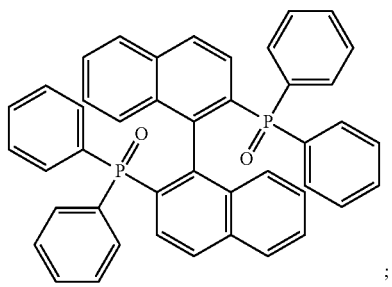
[1,1′-binaphthalen]-2,2′-diylbis
(diphenylphosphine oxide)
(BINAPO),
CAS 86632-33-9, -2.69 V, G8

-continued

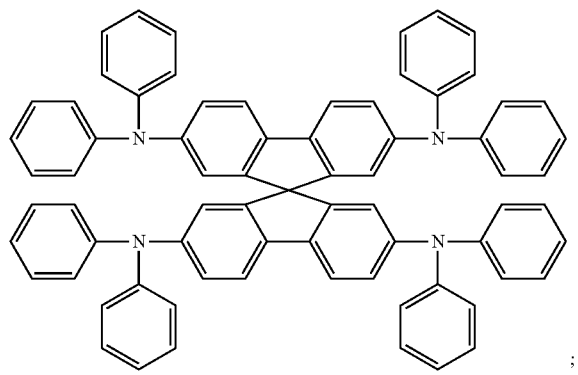

N2,N2,N2',N2',N7,N7,N7',N7'-octaphenyl-9,9'-spirobi[fluorene]-2,2',7,7',-tetraamine (Spiro TAD), CAS 189363-47-1, -3.10 V, G10

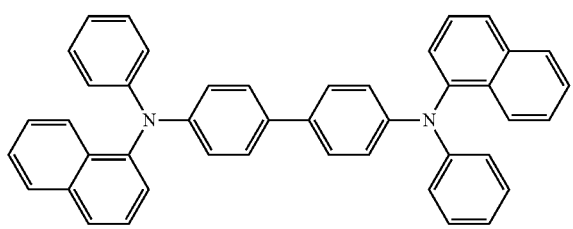

triphenylene,
CAS 217-59-4,
-3.04 V, G11

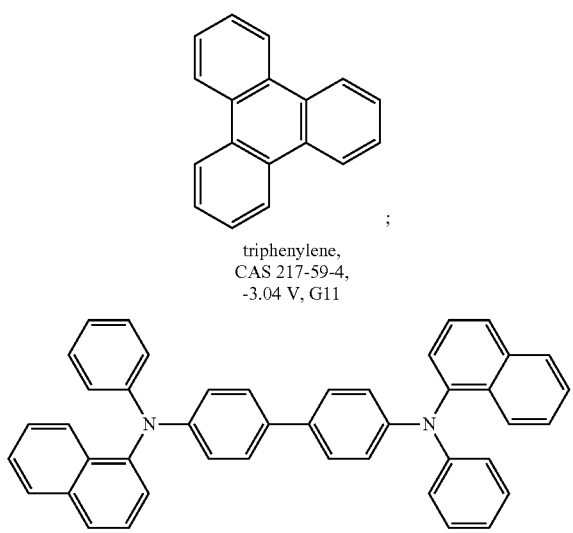

N4,N4'-di(naphthalen-1-yl)-N4,N4'-diphenyl-[1,1'-biphenyl]-4,4'-diamine (alpha-NPD), CAS 123847-85-8, -2.96 V, G12

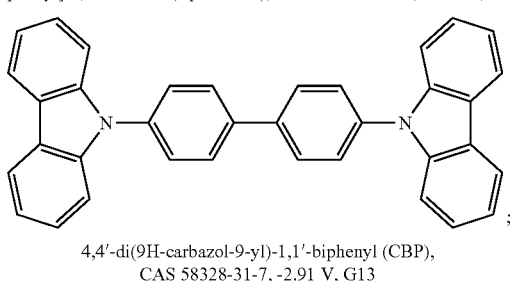

4,4'-di(9H-carbazol-9-yl)-1,1'-biphenyl (CBP),
CAS 58328-31-7, -2.91 V, G13

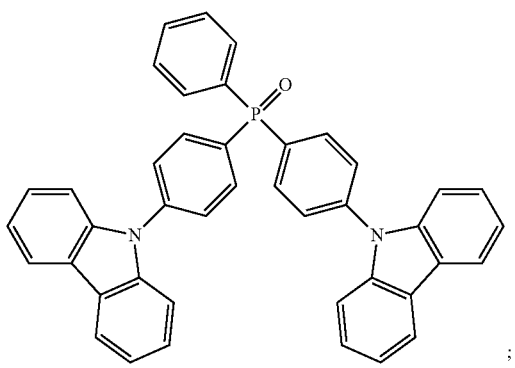

bis(4-(9H-carbazol-9-yl)phenyl)(phenyl)phosphine oxide (BCPO),
CAS 1233407-28-7, -2.86, G14

-continued

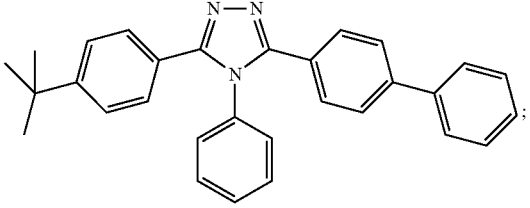

3-([1,1'-biphenyl]-4-yl)-5-(4-(tert-butyl)phenyl)-4-phenyl-4H-1,2,4-triazole (TAZ), -2.76 V, G15

The standardized procedure is described in examples. As the values of redox potentials are readily experimentally accessible and are already known for many compounds from each class of compounds represented by these reference examples, each proven example of doping in a compound of certain class (e.g. triaryl triazine compounds) or subclass gives a valuable hint for applicability of the dopant in other compounds belonging to the same or similar type of matrices, if the substitution pattern provides similar redox potential. The broader the definition of the matrix compound, the broader the range of observed redox potentials. For example, triazine matrices lacking other polar groups have their standard redox potentials roughly in the range between −1.9 V and −2.3 V vs. $Fc^+/Fc$ reference, aromatic hydrocarbons between −2.2 V and −3.1 V, and the redox potential of phosphine oxides having aromatic substituents on the phosphorus atom, may be tuned in extremely broad range roughly between −1.8 V and −3.1 V, depending on the chosen aryl and heteroaryl groups.

Substrate

It can be flexible or rigid, transparent, opaque, reflective, or translucent. The substrate should be transparent or translucent if the light generated by the OLED is to be transmitted through the substrate (bottom emitting). The substrate may be opaque if the light generated by the OLED is to be emitted in the direction opposite of the substrate, the so called top-emitting type. The OLED can also be transparent. The substrate can be either arranged adjacent to the cathode or anode.

Electrodes

The electrodes are the anode and the cathode, they must provide a certain amount of conductivity, being preferentially conductors with high, metallic conductivity. Preferentially the "first electrode" is the anode. At least one of the electrodes must be semi-transparent or transparent to enable the light transmission to the outside of the device. Typical electrodes are layers or a stack of layer, comprising metal and/or transparent conductive oxide. Other possible electrodes are made of thin busbars (e.g. a thin metal grid) wherein the space between the busbars is filled (coated) with a transparent material having certain conductivity, such as graphene, carbon nanotubes, doped organic semiconductors, etc.

In one embodiment, the anode is the electrode closest to the substrate, which is called non-inverted structure. In another mode, the cathode is the electrode closest to the substrate, which is called inverted structure.

Typical materials for the anode are ITO and Ag. Typical materials for the cathode are Mg:Ag (10 vol % of Mg), Ag, ITO, Al. Mixtures and multilayer cathodes are also possible. Preferably, the cathode comprises a metal selected from Ag, Al, Mg, Ba, Ca, Yb, In, Zn, Sn, Sm, Bi, Eu, Li, more preferably from Al, Mg, Ca, Ba and even more preferably selected from Al or Mg. Preferred is also a cathode comprising an alloy of Mg and Ag.

It is one of the advantages of the present invention that it enables broad selection of cathode materials. Besides metals with low work function which are in most cases necessary for good performance of devices comprising the state-of-art n-doped ETL materials, also other metals or conductive metal oxides may be used as cathode materials. An advantageous embodiment is the use of cathodes prepared of metallic silver, because neat silver provides the best reflectivity, and thus best efficiency, specifically e.g. in bottom emitting devices built on a transparent substrate and having a transparent conductive oxide anode. Neat silver cathodes are not built into devices having undoped ETLs or ETLs doped with metal salt additives, because such devices show high operational voltages and low efficiencies due to poor electron injection.

It is equally well possible that the cathode is pre-formed on a substrate (then the device is an inverted device), or the cathode in a non-inverted device is formed by vacuum deposition of a metal or by sputtering.

Hole-Transporting Layer (HTL)

The HTL is a layer comprising a large gap semiconductor responsible to transport holes from the anode or holes from a CGL to the light emitting layer (LEL). The HTL is comprised between the anode and the LEL or between the hole generating side of a CGL and the LEL. The HTL can be mixed with another material, for example a p-dopant, in which case it is said the HTL is p-doped. The HTL can be comprised by several layers, which can have different compositions. P-doping of the HTL lowers its resistivity and avoids the respective power loss due to the otherwise high resistivity of the undoped semiconductor. The doped HTL can also be used as optical spacer, because it can be made very thick, up to 1000 nm or more without significant increase in resistivity.

Suitable hole transport matrices (HTM) can be, for instance, compounds from the diamine class, where a delocalized pi-electron system conjugated with lone electron pairs on the nitrogen atoms is provided at least between the two nitrogen atoms of the diamine molecule. Examples are N4,N4'-di(naphthalen-1-yl)-N4,N4'-diphenyl-[1,1'-biphenyl]-4,4'-diamine (HTM1), N4,N4, N4'',N4''-tetra([1,1'-biphenyl]-4-yl)-[1,1':4',1''-terphenyl]-4,4''-diamine (HTM2). The synthesis of diamines is well described in literature; many diamine HTMs are readily commercially available.

Hole-Injecting Layer (HIL)

The HIL is a layer which facilitates the injection of holes from the anode or from the hole generating side of a CGL into an adjacent HTL. Typically, the HIL is a very thin layer (<10 nm). The hole injection layer can be a pure layer of p-dopant and can be about 1 nm thick. When the HTL is doped, an HIL may not be necessary, since the injection function is already provided by the HTL.

Light-Emitting Layer (LEL)

The light emitting layer must comprise at least one emission material and can optionally comprise additional layers. If the LEL comprises a mixture of two or more materials the charge carrier injection can occur in different materials for instance in a material which is not the emitter, or the charge carrier injection can also occur directly into the emitter. Many different energy transfer processes can occur inside the LEL or adjacent LELs leading to different types of emission. For instance excitons can be formed in a host material and then be transferred as singlet or triplet excitons to an emitter material which can be singlet or triplet emitter which then emits light. A mixture of different types of emitter can be provided for higher efficiency. White light can be realized by using emission from an emitter host and an emitter dopant. In one of possible embodiments, the light emitting layer may comprise at least one polymer. There are known many fluorescent polymers; alternatively or in addition, the polymer may serve as a host for a phosphorescent emitter. In another embodiment, the emitter may be a low-molecular compound processable by vacuum thermal evaporation. Metal-free organic compounds, for example polycyclic aromatic hydrocarbons, polycyclic heteroaromatic compounds, polycyclic aromatic amines, and compounds designed as various combinations of such building blocks, are frequently used as fluorescent emitters, whereas metal complexes or organometallic compounds frequently serve as phosphorescent emitters.

Hole Blocking Layer (HBL) and Electron Blocking Layer (EBL)

Blocking layers can be used to improve the confinement of charge carriers in the LEL, these blocking layers are further explained in U.S. Pat. No. 7,074,500 B2.

Electron-Transporting Layer (ETL)

The ETL is a layer comprising a large gap semiconductor responsible for electron transport from the cathode or electrons from a CGL or EIL (see below) to the LEL. The ETL is comprised between the cathode and the LEL or between the electron generating side of a CGL and the LEL. The ETL can be mixed with an electrical n-dopant, in which case it is said the ETL is n-doped. The ETL can be comprised by several layers, which can have different compositions. Electrical n-doping the ETL lowers its resistivity and/or improves its ability to inject electrons into an adjacent layer and avoids the respective power loss due to the otherwise high resistivity (and/or bad injection ability) of the undoped semiconductor. If the used electrical doping creates new charge carriers in the extent that substantially increases conductivity of the doped semiconducting material in comparison with the undoped ETM, then the doped ETL can also be used as optical spacer, because it can be made very thick, up to 1000 nm or more without significant increase in the operational voltage of the device comprising such doped ETL. One often preferred mode of electrical doping that is supposed to create new charge carriers is so called redox doping. In case of n-doping, the redox doping corresponds to the transfer of an electron from the dopant to a matrix molecule.

In case of electrical n-doping with metals used as dopants in their substantially elemental form, it is supposed that the electron transfer from the metal atom to the matrix molecule results in a metal cation and an anion radical of the matrix molecule. Hopping of the single electron from the anion radical to an adjacent neutral matrix molecule is the currently supposed mechanism of charge transport in redox n-doped semiconductors.

Preparation of electron transport semiconducting materials comprising a substantially covalent matrix n-doped with alkali metals by the process of the present invention is one of preferred modes of the invention. As disclosed in the summary of the invention, the chemical composition of the substantially covalent matrix material is not particularly limited. Advantageous are matrix compounds comprising polar groups, for example organic compounds comprising a nitrogen or phosphorus heterocycle, or compounds comprising a phosphine oxide group. Among matrices comprising phosphorus heterocycles, phosphepine compounds have been proven as very good matrix compounds.

It is still hard to explain all properties of semiconductors n-doped with metals strictly in terms of electrical redox doping as described above. Especially the yet unknown synergies between first and second metal as observed in semiconducting materials of present invention represent an additional hint that metal doping in substantially covalent matrix materials may advantageously combine redox doping with certain effects of mixing matrix materials with metal atoms and/or their clusters. All observed effects are, however, compatible with commonly accepted hypothesis that metal doped semiconducting materials contain at least part of the added metallic elements in their substantially elemental form.

Other layers with different functions can be included, and the device architecture can be adapted as known by the skilled in the art. For example, an Electron-Injecting Layer (EIL) made of metal, metal complex or metal salt can be used between the cathode and the ETL.

Charge generation layer (CGL)

The OLED can comprise a CGL which can be used in conjunction with an electrode as inversion contact, or as connecting unit in stacked OLEDs. A CGL can have various configurations and names, examples are pn-junction, connecting unit, tunnel junction, etc. Examples are pn-junctions as disclosed in US 2009/0045728 A1, US 2010/0288362 A1.

Stacked OLEDs

When the OLED comprises two or more LELs separated by CGLs, the OLED is called a stacked OLED, otherwise it is called a single unit OLED. The group of layers between two closest CGLs or between one of the electrodes and the closest CGL is called a electroluminescent unit (ELU). Therefore, a stacked OLED can be described as anode/$ELU_1/\{CGL_X/ELU_{1+X}\}_X$/cathode, wherein x is a positive integer and each $CGL_X$ or each $ELU_{1+X}$ can be equal or different. The CGL can also be formed by the adjacent layers of two ELUs as disclosed in US2009/0009072 A1. Further stacked OLEDs are described e.g. in US 2009/0045728 A1, US 2010/0288362 A1, and references therein.

Deposition of Organic Layers

Any organic layer of the electronic device can be deposited by known techniques, such as vacuum thermal evaporation (VTE), organic vapour phase deposition, laser induced thermal transfer, spin coating, blade coating, slot dye coating, inkjet printing, etc. A preferred method for preparing the OLED according to the invention is vacuum thermal evaporation. Polymeric materials are preferably processed by coating techniques from solutions in appropriate solvents.

Metal Deposition

For the function of metal containing layer of present invention in electronic devices, it is desirable that the layer contains at least part of the at least one first metal and, if present, at least part of the at least one second metal in their substantially elemental forms.

Similarly as metal alloy, also metal vapour is considered as necessarily comprising the metal in a substantially elemental form, if released from a composition comprising only metals and/or metal alloys. Typically, caesium vapour release from gallium or bismuth alloys according to EP 1 648 042 B1 or WO2007/109815 is understood as the evaporation of one metallic component from a substantially metallic composition providing thus substantially elemental form of the evaporated caesium metal.

In the process of the present invention at least one first metal and at least one second metal are vaporized from their alloy, thus ensuring their deposition in a substantially elemental form.

It shall be mentioned that alkali metal containing layers were so far accessible only using elemental metals or alloys which are very reactive. Moreover, operational temperature range of known alkali metal sources hardly fits with the operational temperature range for vaporization of usual charge transport matrices used in organic electronic devices. For more complex materials comprising more than one doping metal, the single choice so far was the use an additional vaporization source for each additional component.

This conventional process has its advantage in the possibility of adjusting the temperature of each of the first, second and third vaporization source separately, thereby enabling an easier adjustment of vaporization rates of the first metal, second metal and the matrix compound to their different volatilities. The disadvantages are complexity of the equipment and difficulty to ensure reproducible deposition ratio of all components on large area substrates.

These well-known disadvantages set the practical limit on the controllable number of evaporation sources. In the laboratory scale, co-evaporations of three different materials from three separated evaporation sources are manageable. In mass production requiring the deposition on large-area substrates, the practical limit for the number of vaporization sources is also 3, but the quality assurance in this setting becomes extremely difficult and can be achieved only at the expense of significant limitations in the process throughput.

The key contribution of the inventors consists in designing the metal composition in the form of an alloy comprising, besides of the alkali metal, the second metal which fulfils two conditions—it has a measurable volatility in the operational pressure and temperature range of contemporary VTE processes used for preparation of organic electronic devices, and it is able to form with the chosen alkali metal at least one homogeneous phase.

It was further found as particularly advantageous if the homogeneous phase comprising the first and the second metal has a sufficiently high melting point, preferably above the melting point of the first metal as well as above the melting point of the second metal. Depending on the operational pressure, it can enable the most preferable embodiment of the inventive process, wherein the composition of the first and the second metal sublimes congruently, without change in the ratio of the first and of the second metal. In this embodiment, the ratio of vaporization rates of the first and of the second metal becomes independent from the temperature of the first vaporization source loaded with the composition, and the temperature of the first vaporization source controls the overall vaporization rate of the first and second metal together, in the fixed atomic ratio set by the design of the composition.

As regards the deposition step, according to the choice of the second metal and deposition conditions, especially the operational pressure and the temperature of the surface on which the metal containing layer shall deposit, the ratio of the first and second metal can be controlled in broad range.

Electrical Doping

The most reliable and, at the same time, efficient OLEDs are OLEDs comprising electrically doped layers. Generally, the electrical doping means improving of electrical properties, especially the conductivity and/or injection ability of a doped layer in comparison with neat charge-transporting matrix without a dopant. In the narrower sense, which is usually called redox doping or charge transfer doping, hole transport layers are doped with a suitable acceptor material (p-doping) or electron transport layers with a donor material (n-doping), respectively. Through redox doping, the density of charge carriers in organic solids (and therefore the conductivity) can be increased substantially. In other words, the redox doping increases the density of charge carriers of a semiconducting matrix in comparison with the charge carrier density of the undoped matrix. The use of doped charge-carrier transport layers (p-doping of the hole transport layer by admixture of acceptor-like molecules, n-doping of the electron transport layer by admixture of donor-like molecules) in organic light-emitting diodes is, e.g., described in US 2008/203406 and U.S. Pat. No. 5,093,698.

US2008227979 discloses in detail the charge-transfer doping of organic transport materials, with inorganic and with organic dopants. Basically, an effective electron transfer occurs from the dopant to the matrix increasing the Fermi level of the matrix. For an efficient transfer in a p-doping case, the LUMO energy level of the dopant is preferably more negative than the HOMO energy level of the matrix or at least not more than slightly more positive, preferably not more than 0.5 eV more positive than the HOMO energy level of the matrix. For the n-doping case, the HOMO energy level of the dopant is preferably more positive than the LUMO energy level of the matrix or at least not more than slightly more negative, preferably not more than 0.5 eV lower compared to the LUMO energy level of the matrix. It is furthermore desired that the energy level difference for energy transfer from dopant to matrix is smaller than +0.3 eV.

Typical examples of known redox doped hole transport materials are: copper phthalocyanine (CuPc), which HOMO level is approximately −5.2 eV, doped with tetrafluorotetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis (naphthalen-1-yl)-N,N'-bis(phenyl)-benzidine) doped with F4TCNQ. α-NPD doped with 2,2'-(perfluoronaphthalene-2, 6-diylidene) dimalononitrile (PD1). α-NPD doped with 2,2', 2"-(cyclopropane-1,2,3-triylidene)tris(2-(p-cyanotetrafluorophenyl)acetonitrile) (PD2). All p-doping in the device examples of the present application was done with 8 mol % of PD2.

Typical examples of known redox doped electron transport materials are: fullerene C60 doped with acridine orange base (AOB); perylene-3,4,9,10-tetracarboxylic-3,4,9,10-dianhydride (PTCDA) doped with leuco crystal violet; 2,9-di (phenanthren-9-yl)-4,7-diphenyl-1,10-phenanthroline doped with tetrakis (1,3,4,6,7,8-hexahydro-2H-pyrimido [1,2-a] pyrimidinato) ditungsten (II) ($W_2(hpp)_4$); naphthalene tetracarboxylic acid di-anhydride (NTCDA) doped with 3,6-bis-(dimethyl amino)-acridine; NTCDA doped with bis (ethylene-dithio) tetrathiafulvalene (BEDT-TTF).

Besides the redox dopants, certain metal salts can be alternatively used for electrical n-doping resulting in lowering operational voltage in devices comprising the doped layers in comparison with the same device without metal salt. True mechanism how these metal salts, sometimes called "electrically doping additives", contribute to the lowering of the voltage in electronic devices, is not yet known. It is believed that they change potential barriers on the interfaces between adjacent layers rather than conductivities of the doped layers, because their positive effect on operational voltages is achieved only if layers doped with these additives are very thin. Usually, the electrically undoped or additive doped layers are thinner than 50 nm, preferably thinner than 40 nm, more preferably thinner than 30 nm, even more preferably thinner than 20 nm, most preferably thinner than 15 nm. If the manufacturing process is precise enough, the additive doped layers can be advantageously made thinner than 10 nm or even thinner than 5 nm.

Typical representatives of metal salts which are effective as electrical dopants are salts comprising metal cations bearing one or two elementary charges. Favourably, salts of alkali metals or alkaline earth metals are used. The anion of the salt is preferably an anion providing the salt with sufficient volatility, allowing its deposition under high vacuum conditions, especially in the temperature and pressure range which is comparable with the temperature and pressure range suitable for the deposition of the electron transporting matrix.

Example of such anion is 8-hydroxyquinolinolate anion. Its metal salts, for example lithium 8-hydroxyquinolinolate (LiQ) represented by the formula D1

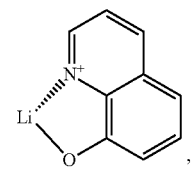

D1 are well known as electrically doping additives.

Another class of metal salts useful as electrical dopants in electron transporting matrices represent compounds disclosed in the application PCT/EP2012/074127 (WO2013/079678), having general formula (II)

Formula (II)

wherein $A^1$ is a $C_6$-$C_{20}$ arylene and each of $A^2$-$A^3$ is independently selected from a $C_6$-$C_{20}$ aryl, wherein the aryl or arylene may be unsubstituted or substituted with groups comprising C and H or with a further LiO group, provided that the given C count in an aryl or arylene group includes also all substituents present on the said group. It is to be understood that the term substituted or unsubstituted arylene stands for a divalent radical derived from substituted or unsubstituted arene, wherein the both adjacent structural moieties (in formula (I), the OLi group and the diaryl prosphine oxide group) are attached directly to an aromatic ring of the arylene group. This class of dopants is represented by compound D2

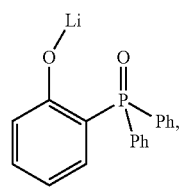

D2 wherein Ph is phenyl.

Yet another class of metal salts useful as electrical dopants in electron transporting matrices represent compounds disclosed in the application PCT/EP2012/074125 (WO2013/079676), having general formula (III)

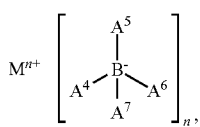

Formula (III)

wherein M is a metal ion, each of $A^4$-$A^7$ is independently selected from H, substituted or unsubstituted $C_6$-$C_{20}$ aryl and substituted or unsubstituted $C_2$-$C_{20}$ heteroaryl and n is valence of the metal ion. This class of dopants is represented by compound D3

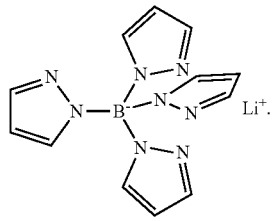

D3

Additive materials can be utilized in devices according to present invention for example in an electron injection or electron transport layer, whereas the inventive metal containing layer is implemented as a charge generation layer. Alternatively or in addition, the metal containing layer according to present invention can be implemented as electron injection and/or electron transport layer, whereas the additive can be used in charge generation layer.

V. ADVANTAGEOUS EFFECT OF THE INVENTION

Despite practical importance of electrical doping in organic semiconductors, studies of metal doped semiconducting materials so far remained, due to experimental obstacles in laboratory and technical obstacles—and corresponding QA issues in manufacturing—limited practically exclusively to simplest systems consisting of one metal and one matrix compound.

Moreover, practical application of alkali metals, which as the most active n-dopants offer the applicability in the broadest spectrum of various matrix materials, remained so far quite limited due to difficult handling and QA obstacles.

By providing alkali metal source which is air stable and well controllable in the operational range of current VTE processes for deposition of usual matrix materials in organic electronic device mass production, the present invention significantly broadens and improves generic accessibility of layers comprising alkali metals, as well as the practical applicability of n-doping with alkali metals in electronic devices.

The unexpected finding of inventors that alloys of the first and second metal as described in this application may be congruently sublimed without substantial change in their composition enabled, moreover, an unexpected progress in studies of complex doped materials and complex substantially metallic layers.

Studying these systems in detail, the inventors arrived at another expected finding shown by experimental results (from experimental device described in detail in Example 1 below).

The observed voltages, quantum efficiencies and y-coordinate in the colour space according to International Commission on Illumination (CIE) at a current density 10 mA/cm² are reported in the Table 1.

TABLE 1

| matrix (wt %) | First metal (wt %) | Second metal (wt %) | U (V) | EQE (%) | CIE1931y |
|---|---|---|---|---|---|
| 95.00 | Li (5.00) | — (0) | 5.81 | 5.35 | 0.095 |
| 75.00 | K (1.10) | Zn (23.9) | 4.67 | 4.69 | 0.099 |
| 75.00 | Na (0.14) | Zn (24.86) | 3.77 | 6.34 | 0.096 |
| 75.00 | Na (0.36) | Zn (24.64) | 3.81 | 5.97 | 0.097 |
| 75.00 | Na (0.63) | Zn (24.37) | 3.80 | 6.03 | 0.095 |
| 75.00 | Na (2.44) | Zn (23.56) | 3.83 | 5.60 | 0.094 |
| 75.00 | — (0) | Te (25.00) | 6.68 | 2.44 | 0.107 |
| 70.38 | Li (4.98) | Te (24.64) | 3.91 | 5.73 | 0.110 |

Surprisingly, by changing the ratio of the first and second metal, whereas the overall amount of the first and second metal is kept constant, significant tuning of the performance of the experimental device is possible. Obviously, despite Te is very poor dopant and Zn (results not shown as the device gave no light) alone is practically inactive, their interplay with alkali metals brings a noteworthy synergy, allowing to replace part of the first metal with the second metal without loss of performance or with a performance improvement, in some cases.

Despite layers showing these unexpected synergies between the first and the second metal and devices comprising such layers are, in principle, accessible also by conventional methods, as shown on the example of device exploiting doped layer comprising the combination Li and Te as the first and the second metal (see the last line in the Table 1), the process according to present invention offers a more advantageous alternative to conventional processes.

An additional advantage of the invention, which is particularly relevant for industrial manufacturing, is easy handling of alkali metals in the form of their alloys with second metals described above. The authors found out that especially alloys with alkali metal content below 20 weight % and, more preferably, below 10 weight %, can be handled without special precautions under ambient conditions.

Finally, it was surprisingly found that the materials, layers and devices prepared by the inventive process provided by the inventors often exhibit favourable differences in comparison with seemingly similar materials, layers and devices prepared by conventional way. For example, the inventive metal containing layers significantly differ from known metallic layers consisting of single electropositive metal, e.g. Li. Whereas the known layers usually show a quite sharp thickness optimum, devices comprising the inventive layers with significantly higher thicknesses were still proven efficient.

Furthermore, the inventive metal containing layers exhibit quite surprising optical properties, e.g. improved optical transparency in comparison with layers of neat metals having comparable thickness.

These findings open new options for design and manufacturing of conducting materials and devices as well as for their manufacturing in industrial scale.

VI. EXAMPLES

Auxiliary Materials

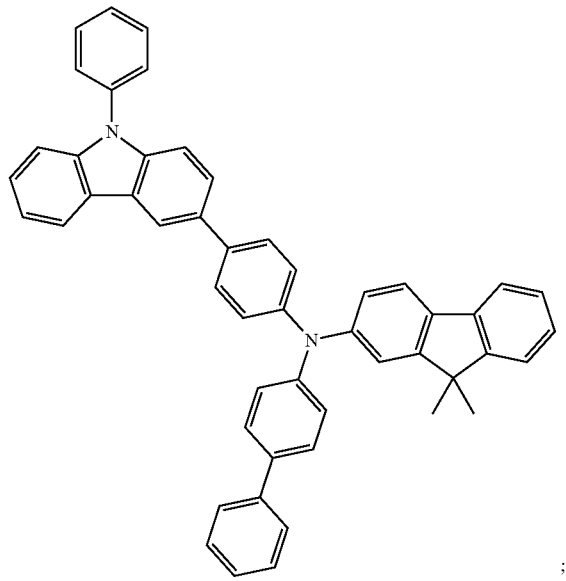

biphenyl-4-yl(9,9-diphenyl-9H-fluoren-2-yl)-4-(9-phenyl-9H-carbazol-3-yl)phenyl]-amine, CAS 1242056-42-3, A1

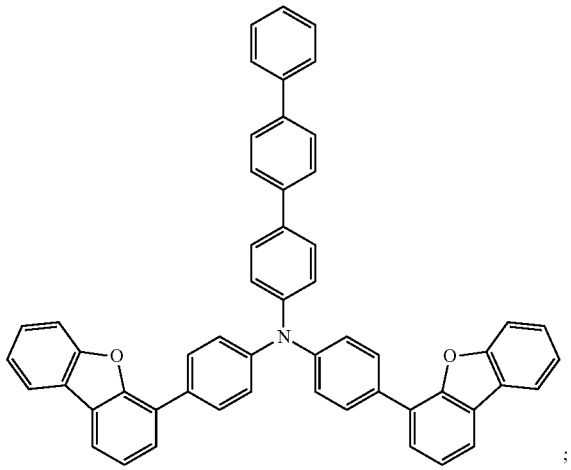

N,N-bis(4-(dibenzo[b,d]furan-4-yl)phenyl)-[1,1':4,1''-terphenyl]-4-amine (NHT-195), CAS 1198399-61-9, A2

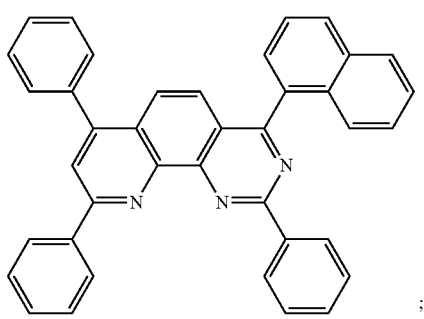

4-(naphtalen-1-yl)-2,7,9-triphenylpyrido[3,2-h]quinazoline, CAS 1314229-30-5, G4

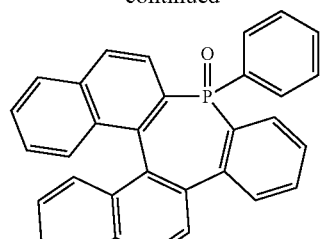

3-phenyl-3H-benzo[b]dinaphto[2,1-d:1',2'-f]phosohepine-3-oxide, CAS 597578-38-6, A4

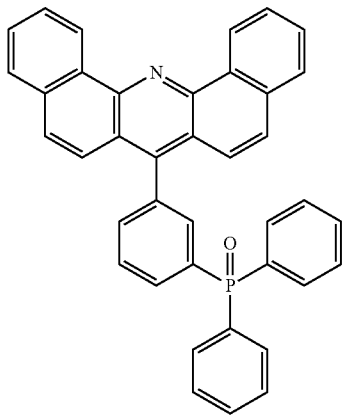

(3-(dibenzo[c,h]acridin-7-yl)phenyl)diphenylphosphine oxide, CAS 1440545-22-1, described in WO2013/079217, A5

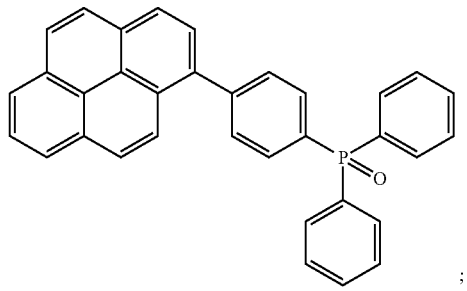

diphenyl(4-(pyren-1-yl)phenyl)phosphine oxide, CAS 51-7, described in WO2015/052284A1, A6

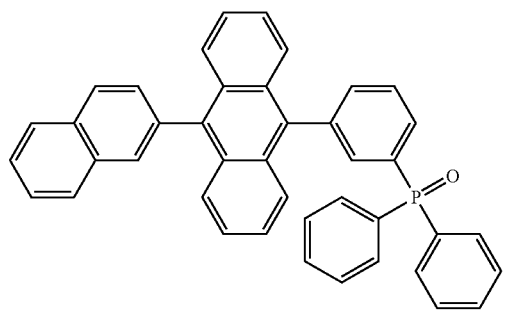

(3-(10-(naphtalen-2-yl)antracen-9-yl)phenyl)dipenylphosphine oxide, described in WO2015/052284A1, A7

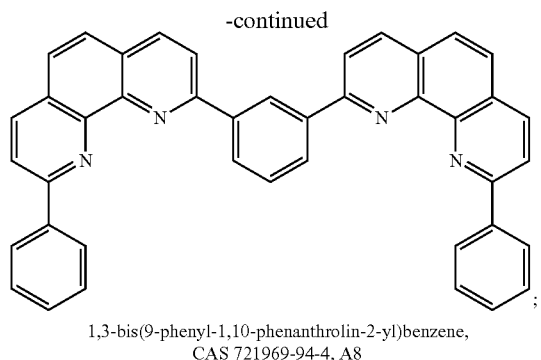

1,3-bis(9-phenyl-1,10-phenanthrolin-2-yl)benzene,
CAS 721969-94-4, A8

Auxiliary Procedures
Cyclic Voltammetry

The redox potentials given at particular compounds were measured in an argon deaerated, dry 0.1 M THF solution of the tested substance, under argon atmosphere, with 0.1M tetrabutylammonium hexafluorophosphate supporting electrolyte, between platinum working electrodes and with an Ag/AgCl pseudo-standard electrode, consisting of a silver wire covered by silver chloride and immersed directly in the measured solution, with the scan rate 100 mV/s. The first run was done in the broadest range of the potential set on the working electrodes, and the range was then adjusted within subsequent runs appropriately. The final three runs were done with the addition of ferrocene (in 0.1M concentration) as the standard. The average of potentials corresponding to cathodic and anodic peak of the studied compound, after subtraction of the average of cathodic and anodic potentials observed for the standard $Fc^+/Fc$ redox couple, afforded finally the values reported above. All studied phosphine oxide compounds as well as the reported comparative compounds showed well-defined reversible electrochemical behaviour.

SYNTHESIS EXAMPLES

The synthesis of metal alloys was accomplished by standard metallurgical procedures, by melting elements under argon atmosphere in sealed tantalum or ceramic crucibles.

Prepared alloys were tested as evaporable dopants for preparation of semiconducting materials, both directly as well as after purification by vacuum preparative sublimation.

Examples of the use of prepared alloys are given in the Table 1 and in the Table 2, in terms of the weight ratio of the first and second metal. More specifically, if a matrix was doped for example with a K—Zn alloy according to line 3 of the Table 1, then the weight ratio of K to Zn in the K—Zn alloy used for doping was 1.10 to 23.9; in other words, the alloy consisted of 4.40 wt % K and 95.60 wt % Zn.

DEVICE EXAMPLES

Example 1 (Blue OLED Comprising a Metal-Doped Electron Transport Layer)

A first blue emitting device was made by depositing a 10 nm layer of A1 doped with PD2 (matrix to dopant weight ratio of 92:8 wt %) onto an ITO-glass substrate, followed by a 125 nm undoped layer of A2. Subsequently, a blue fluorescent emitting layer of ABH113 (Sun Fine Chemicals) doped with NUBD370 (Sun Fine Chemicals) (97:3 wt %) was deposited with a thickness of 20 nm. A 4 nm interlayer of compound A3 and 35 nm tested metal-containing layer were deposited subsequently on the emitting layer. The tested layer was processed using the compound A4 as the matrix and with the content of the first and second metal as shown in the Table 1, either by co-evaporation of three components from three separate vaporization sources, or using the inventive process exploiting the alloys which elemental composition be easily derived from the table. Finally, an aluminium layer with a thickness of 100 nm deposited as a cathode on top of the testing semiconducting layer.

The observed voltages and quantum efficiencies at a current density 10 $mA/cm^2$ reported in the Table 1.

Example 2 (Blue OLED Comprising a Metallic Electron Injecting Layer)

A second blue emitting device was made by depositing a 10 layer of A1 doped with PD2 (matrix to dopant weight ratio of 92:8 wt %) onto an ITO-glass substrate, followed by a 125 nm undoped layer of A1 and 5 nm doped layer of A2. Subsequently, a blue fluorescent emitting layer of ABH113 (Sun Fine Chemicals) doped with NUBD370 (Sun Fine Chemicals) (97:3 wt %) was deposited with a thickness of 20 nm. A 35 layer of a chosen matrix compound was deposited subsequently on the emitting layer, followed by 10 nm thick electron injection layer formed by deposition of Na—Zn alloy comprising 2.6 wt % Na and 97.4 wt % Zn. Finally, an aluminium layer with a thickness of 100 nm was deposited as a cathode on top of the testing se conducting layer.

The observed voltages, quantum efficiencies and y-coordinate in the CIE colour space at a current density 10 $mA/cm^2$ are reported in the Table 2.

TABLE 2

| matrix | U (V) | EQE (%) | CIE1931y |
| --- | --- | --- | --- |
| A7 | 3.33 | 5.97 | 0.098 |
| A6 | 3.23 | 5.27 | 0.091 |
| A5 | 3.76 | 5.72 | 0.096 |
| A4 | 3.35 | 5.93 | 0.096 |

Example 3 (Model Device Comprising Elemental Mg and Li in One Layer)

A Li—Mg alloy comprising 3.75 wt % Li and 96.25 wt % Mg was co-deposited in the weight ratio 5:95 with compound A8 to form a homogeneous 50 nm thick layer between two metallic contacts. The layer had conductivity of the order $10^{-4}$ $S \cdot m^{-1}$. In a comparative experiment, neat Mg was co-deposited with compound A8 in the same arrangement and equivalent weight ratio 5:95, to form a homogeneous 50 nm thick layer. The observed conductivity was lower than $10^{-8}$ $S \cdot m^{-1}$. An optical emission spectroscopy analysis (ICP-OES) of the Li—Mg alloy deposited independently on an ITO substrate confirmed that both Li as well as Mg vaporize from the alloy. As compound A8 is well-known as a good matrix for redox n-doping with Li in substantially metallic form, the observed conductivity of the organic layer doped with the Li—Mg alloy in the model device confirmed that Li co-vaporizes with Mg from its alloy with Mg and that the air stable Li—Mg alloy can be successfully used as a redox n-dopant instead of neat lithium metal which is highly air sensitive.

Example 4 (Blue OLED Comprising Elemental Mg and Li in One Layer)

A third blue emitting device was made by depositing a 10 nm layer of A1 doped with PD2 (matrix to dopant weight ratio of 92:8 wt %) onto an ITO-glass substrate, followed by a 118 nm undoped layer of A1. Subsequently, a blue fluorescent emitting layer of ABH113 (Sun Fine Chemicals) doped with NUBD370 (Sun Fine Chemicals) (97:3 wt %) was deposited with a thickness of 19 nm. The tested layer was processed using the compound A8 as the matrix and the Li—Mg alloy comprising 3.75 wt % Li and 96.25 wt % Mg as the n-dopant. The content of the matrix and of the dopant is shown in the Table 3. Finally, an aluminium layer with a thickness of 100 nm was deposited as a cathode on top of the testing semiconducting layer.

The observed voltages, quantum efficiencies and y-coordinates in the CIE colour space at a current density 10 mA/cm$^2$ are reported in the Table 3.

TABLE 3

| matrix (wt %) | n-dopant (wt %) | U (V) | EQE (%) | CIE1931y |
|---|---|---|---|---|
| 98.804 | 1.20 | 3.45 | 3.20 | 0.101 |
| 100.00 | 0 | 8.93 | 3.72 | 0.097 |
| 94.87 | 5.13 | 4.34 | 3.15 | 0.099 |
| 99.57 | 0.43 | 3.99 | 4.14 | 0.098 |

Used Abbreviations at % atomic percent
CGL charge generating layer
International Commission on Illumination
CV cyclic volt
DCM dichloromethane
DSC differential scanning calorimetry
EIL electron injecting layer
EQE external quantum efficiency of electroluminescence
ETL electron transporting layer
ETM electron transport matrix
EtOAc ethyl acetate
Fc$^+$/Fc ferrocenium/ferrocene reference system
h hour
HIL hole injecting layer
HOMO highest occupied molecular orbital
HTL hole transporting layer
HTM hole transport matrix
ITO indium tin oxide
ICP-OES optical emission spectroscopy with inductively coupled plasma
LUMO lowest unoccupied molecular orbital
LEL light emitting layer
LiQ lithium 8-hydroxyquinolinolate
MeOH methanol
mol % molar percent
OLED organic light emitting diode
QA quality assurance
RT room temperature
THF tetrahydrofuran
ultraviolet (light)
vol % volume percent
v/v volume/volume (ratio)
VTE vacuum thermal evaporation
wt % weight (mass) percent

The invention claimed is:

1. A process for preparing a metal containing layer, the process comprising
   (i) at least one step of co-vaporization, at a pressure which is lower than $10^{-2}$ Pa, of
      a) at least one first metal selected from Li, Na, K, Rb, and Cs and
      b) at least one second metal selected Mg, Zn, Hg, Cd, and Te from a metal alloy provided in a first vaporization source which is heated to a temperature between 100° C. and 600° C., and
   (ii) at least one subsequent step of deposition of the first metal on a surface having a temperature which is below the temperature of the first vaporization source,
   wherein in step (i),
   the alloy is provided at least partly in form of a homogeneous phase comprising the first metal and the second metal.

2. The process according to claim 1, wherein step (i) further comprises in the at least one step of co-vaporization, at a pressure which is lower than $10^{-2}$ Pa, co-vaporization of at least one substantially covalent matrix compound from a substantially covalent matrix material provided in a second vaporization source, wherein the second vaporization source is heated to a temperature between 100° C. and 600° C.; and
   wherein, in step (ii), the at least one substantially covalent matrix compound is co-deposited on the surface having a temperature which is below the temperature of the first vaporization source and below the temperature of the second vaporization source.

3. The process according to claim 1, wherein, in step (ii), the second metal is co-deposited with the first metal on the surface having a temperature which is below the temperature of the first vaporization source.

4. The process according to claim 1, wherein the temperature of the first vaporization source is lower than the melting point of the metal alloy.

5. The process according to claim 1, wherein the metal alloy has the melting point which is higher than the at least one first metal and/or the at least one second metal.

6. The process according to claim 1, wherein the total amount of the first metal is less than 95 weight %, with respect to the total amount of the first and the second metal in the alloy.

7. The process according to claim 1, wherein with respect to total amount of the first metal and of the second metal in the alloy, the total amount of the first metal is at least 0.01 weight %.

8. The process according to claim 1, wherein the first metal is sodium and/or the second metal is zinc.

9. The process according to claim 1, wherein the first metal is lithium and/or the second metal is magnesium.

10. The process according to claim 2, wherein the substantially covalent matrix compound is an organic matrix compound.

11. A process for preparing an electronic device comprising at least two distinct layers sandwiched between a first electrode and a second electrode, wherein at least one of the distinct layers comprises at least one first metal selected from the group consisting of Li, Na, K, Rb, and Cs, the process comprising the steps:
    (i) providing subsequently the first electrode, and
    (ii) providing the layer containing the first metal by the process according to claim 1.

12. The process according to claim 1, wherein, in step (ii), the second metal is co-deposited with the first metal and with the substantially covalent matrix compound on the surface having a temperature which is below the temperature of the first vaporization source.

13. An electronic device comprising at least two distinct layers sandwiched between a first electrode and a second electrode, wherein at least one of the distinct layers comprises
 (a) at least one first metal selected from the group consisting of Li, Na, K, Rb, and Cs,
 (b) at least one second metal selected from the group consisting of Mg, Zn, Hg, Cd, and Te, and
 (c) at least one substantially covalent matrix compound, obtainable by a process comprising the steps
 (i) providing subsequently the first electrode, and the layers arranged between the first electrode and the layer comprising the first metal, and
 (ii) providing the layer containing the first metal by the process according to claim 12.

14. A metal containing layer containing at least one first metal selected from Li, Na, K, Rb, and Cs, at least one second metal selected from Mg, Zn, Cd, Hg, and Te, and at least one substantially covalent matrix compound,
 the layer substantially free of components which are more volatile than the most volatile component selected from
 (i) the first metal comprised in the layer,
 (ii) the second metal comprised in the layer and
 (iii) the substantially covalent matrix compound comprised in the layer,
 wherein the layer is obtained by the process according to claim 12.

15. The metal containing layer according to claim 14, wherein with respect to overall weight of the layer, the total amount of the first metal in the layer is at least 0.01 weight %.

16. The metal containing layer according to claim 14, wherein the layer comprises at least 90 atomic % of metallic elements, and the content of the second metal in the layer is at least 80 weight %.

17. A use of a metal alloy, the alloy comprising at least one homogeneous phase comprising at least one first metal selected from Li, Na, K, Rb, and Cs and at least one second metal selected from Mg, Zn, Cd, Hg, and Te, in the process according to claim 1 or 11 for preparation of a layer containing the first metal and/or for preparation of an electronic device comprising the layer containing the first metal.

18. A process for preparing an electronic device comprising at least two distinct layers sandwiched between a first electrode and a second electrode, wherein at least one of the distinct layers comprises
 (a) at least one first metal selected from the group consisting of Li, Na, K, Rb, and Cs, and
 (ba) at least one second metal selected from the group consisting of Mg, Zn, Hg, Cd, and Te, and/or
 (bb) at least one substantially covalent matrix compound, the process comprising the steps:
 (i) providing subsequently the first electrode and the layers arranged between the first electrode and the layer comprising the first metal,
 (ii) providing the layer containing the first metal by the process according to claim 1.

19. A process for preparing an electronic device comprising at least two distinct layers sandwiched between a first electrode and a second electrode and other parts of the device arranged outside the space between the electrodes, wherein at least one of the distinct layers comprises at least one first metal selected from the group consisting of Li, Na, K, Rb, and Cs,
 the process comprising the steps:
 (i) providing subsequently the first electrode and, if present in the device, the layers arranged between the first electrode and the layer comprising the first metal,
 (ii) providing the layer containing the first metal by the process according to claim 1,
 and
 (iii) providing the remaining layers between the layer comprising the first metal and the second electrode, the second electrode, and any other parts of the device arranged outside the space between the electrodes.

20. A process for preparing an electronic device comprising at least two distinct layers sandwiched between a first electrode and a second electrode and other parts of the device arranged outside the space between the electrodes, wherein at least one of the distinct layers comprises
 (a) at least one first metal selected from the group consisting of Li, Na, K, Rb, and Cs
 and
 (ba) at least one second metal selected from the group consisting of Mg, Zn, Hg, Cd, and Te, and/or
 (bb) at least one substantially covalent matrix compound, the process comprising the steps:
 (i) providing subsequently the first electrode and the layers arranged between the first electrode and the layer comprising the first metal,
 (ii) providing the layer containing the first metal by the process according to claim 1,
 and
 (iii) providing the remaining layers between the layer comprising the first metal and the second electrode, the second electrode, and any other parts of the device arranged outside the space between the electrodes.

21. An electronic device comprising at least two distinct layers sandwiched between a first electrode and a second electrode and other parts of the device arranged outside the space between the electrodes, wherein at least one of the distinct layers comprises
 (a) at least one first metal selected from the group consisting of Li, Na, K, Rb, and Cs,
 (b) at least one second metal selected from the group consisting of Mg, Zn, Hg, Cd, and Te, and
 (c) at least one substantially covalent matrix compound, obtainable by a process comprising the steps
 (i) providing subsequently the first electrode and the layers arranged between the first electrode and the layer comprising the first metal,
 (ii) providing the layer containing the first metal by the process according to claim 12, and
 (iii) providing the remaining layers between the layer comprising the first metal and the second electrode and any other parts of the device arranged outside the space between the electrodes.

22. An electronic device comprising at least two distinct layers sandwiched between a first electrode and a second electrode, wherein at least one of the distinct layers comprises
 (a) at least one first metal selected from the group consisting of Li, Na, K, Rb, and Cs, and
 (b) at least one second metal selected from the group consisting of Mg, Zn, Hg, Cd, and Te,
 obtainable by a process comprising the steps
 (i) providing subsequently the first electrode and
 (ii) providing the layer containing the first metal by the process according to claim 3.

23. An electronic device comprising at least two distinct layers sandwiched between a first electrode and a second electrode and other parts of the device arranged outside the space between the electrodes, wherein at least one of the distinct layers comprises (a) at least one first metal selected from the group consisting of Li, Na, K, Rb, and Cs, and (b) at least one second metal selected from the group consisting of Mg, Zn, Hg, Cd, and Te, obtainable by a process comprising the steps (i) providing subsequently the first electrode and the layers arranged between the first electrode and the layer comprising the first metal, (ii) providing the layer containing the first metal by the process according to claim 3, and (iii) providing the remaining layers between the layer comprising the first metal and the second electrode and any other parts of the device arranged outside the space between the electrodes.

24. A metal containing layer containing at least one first metal selected from Li, Na, K, Rb, and Cs and at least one second metal selected from Mg, Zn, Cd, Hg and Te, the layer substantially free of components which are more volatile than the most volatile component selected from (i) the first metal comprised in the layer and (ii) the second metal comprised in the layer, wherein the layer is obtained by the process according to claim 3.

25. A semiconducting electronic device comprising a first electrode, a second electrode, and, arranged between the first and the second electrode, at least one layer comprising a substantially covalent matrix compound, wherein the device comprises at least one substantially isotropic layer comprising (i) lithium and magnesium in substantially elemental form, and (ii) the at least one substantially covalent matrix compound.

26. The semiconducting electronic device according to claim 25, selected from an organic electroluminescent device and organic photovoltaic device.

27. The organic electroluminescent device according to claim 26, wherein the layer comprising lithium and magnesium in substantially elemental form is an electron injection layer, an electron transport layer, or a charge generating layer.

28. A use of an alloy comprising lithium and magnesium for preparation of an electronic device according to claim 25.

29. A use of an alloy comprising lithium and magnesium for preparation of a semiconducting electronic device comprising a first electrode, a second electrode, and, arranged between the first and the second electrode, at least one layer comprising a substantially covalent matrix compound, wherein the device comprises at least one layer comprising lithium and magnesium in substantially elemental form.

30. The use according to claim 29, wherein the semiconducting electronic device is selected from an organic electroluminescent device and an organic photovoltaic device.

* * * * *